(12) United States Patent
Ikeda

(10) Patent No.: US 9,601,483 B2
(45) Date of Patent: Mar. 21, 2017

(54) SEMICONDUCTOR DEVICE

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/003,109

(22) Filed: Jan. 21, 2016

(65) Prior Publication Data

US 2016/0218100 A1    Jul. 28, 2016

(30) Foreign Application Priority Data

Jan. 28, 2015   (JP) ................................ 2015-014820

(51) Int. Cl.

| | | |
|---|---|---|
| *H03K 3/00* | (2006.01) | |
| *H01L 27/06* | (2006.01) | |
| *H01L 49/02* | (2006.01) | |
| *H01L 29/868* | (2006.01) | |
| *H01L 29/872* | (2006.01) | |
| *H02M 3/155* | (2006.01) | |

(52) U.S. Cl.
CPC .......... *H01L 27/0629* (2013.01); *H01L 28/10* (2013.01); *H01L 28/20* (2013.01); *H01L 28/40* (2013.01); *H01L 29/868* (2013.01); *H01L 29/872* (2013.01); *H02M 3/155* (2013.01)

(58) Field of Classification Search
None
See application file for complete search history.

(56) References Cited

U.S. PATENT DOCUMENTS

| | | |
|---|---|---|
| 9,123,536 B2 | 9/2015 | Ikeda |
| 9,142,544 B2 | 9/2015 | Ikeda |
| 2011/0316494 A1 | 12/2011 | Kitamura et al. |
| 2012/0069616 A1 | 3/2012 | Kitamura et al. |
| 2012/0241756 A1 | 9/2012 | Zhang et al. |
| 2014/0284655 A1 | 9/2014 | Ikeda |

(Continued)

FOREIGN PATENT DOCUMENTS

| | | |
|---|---|---|
| JP | 2012-16108 | 1/2012 |
| JP | 2012-85507 | 4/2012 |

(Continued)

*Primary Examiner* — Long Nguyen
(74) *Attorney, Agent, or Firm* — Oblon, McClelland, Maier & Neustadt, L.L.P.

(57) ABSTRACT

A semiconductor device according to an embodiment includes a normally-off transistor having a first drain, a first source electrically connected to a source terminal, and a first gate electrically connected to a gate terminal, a normally-on transistor having a second gate, a second source electrically connected to the first drain, and a second drain electrically connected to a voltage terminal, a first capacitor provided between the gate terminal and the second gate, a first diode having a first anode electrically connected to the first capacitor and the second gate, and a first cathode electrically connected to the first source, a coil component provided between the voltage terminal and the second drain, and a second diode having a second anode electrically connected to the first drain and the second source, and a second cathode electrically connected to the coil component and the voltage terminal.

10 Claims, 6 Drawing Sheets

(56) References Cited

U.S. PATENT DOCUMENTS

| | | | |
|---|---|---|---|
| 2014/0284662 A1* | 9/2014 | Ikeda | H01L 27/0255 257/195 |
| 2015/0270255 A1* | 9/2015 | Ikeda | H01L 27/0255 257/77 |
| 2015/0357321 A1* | 12/2015 | Ikeda | H01L 27/0255 257/76 |
| 2016/0218099 A1* | 7/2016 | Ikeda | H01L 27/0629 |

FOREIGN PATENT DOCUMENTS

| | | |
|---|---|---|
| JP | 2012-212875 | 11/2012 |
| JP | 2014-187059 | 10/2014 |
| JP | 2014-187726 | 10/2014 |

\* cited by examiner

SEMICONDUCTOR DEVICE

CROSS-REFERENCE TO RELATED APPLICATION

This application is based upon and claims the benefit of priority from Japanese Patent Application No. 2015-014820, filed on Jan. 28, 2015, the entire contents of which are incorporated herein by reference.

FIELD

Embodiments described herein relate generally to a semiconductor device.

BACKGROUND

As a material of a next generation power semiconductor device, a group-III nitride semiconductor such as a gallium nitride-based (GaN-based) semiconductor is expected. The GaN-based semiconductor has a wide bandgap, compared to silicon (Si). Therefore, a device of the GaN-based semiconductor achieves high breakdown voltage and small loss, compared to the device of Si.

In a transistor of the GaN-based semiconductor, a high electron mobility transistor (HEMT) structure in which two-dimensional electron gas (2DEG) is used as a carrier is generally applied. The general HEMT is a normally-on transistor that is conductive even when voltage is not applied to a gate. There is a problem in which a normally-off transistor that does not become conductive unless otherwise voltage is applied to the gate is hardly achieved.

In a power circuit or the like that handles large scale power such as hundreds to one thousand volts, normally-off operation is required considering safety. Therefore, proposed is a circuit configuration in which the normally-off operation is achieved by cascode-connecting a normally-on GaN-based semiconductor transistor to a normally-off Si transistor.

However, in such a circuit configuration, there maybe problems in which breakdown of device or degradation in characteristic is caused in the case where overvoltage occurs at a connection point between the two transistors.

DETAILED DESCRIPTION

Figure 1:
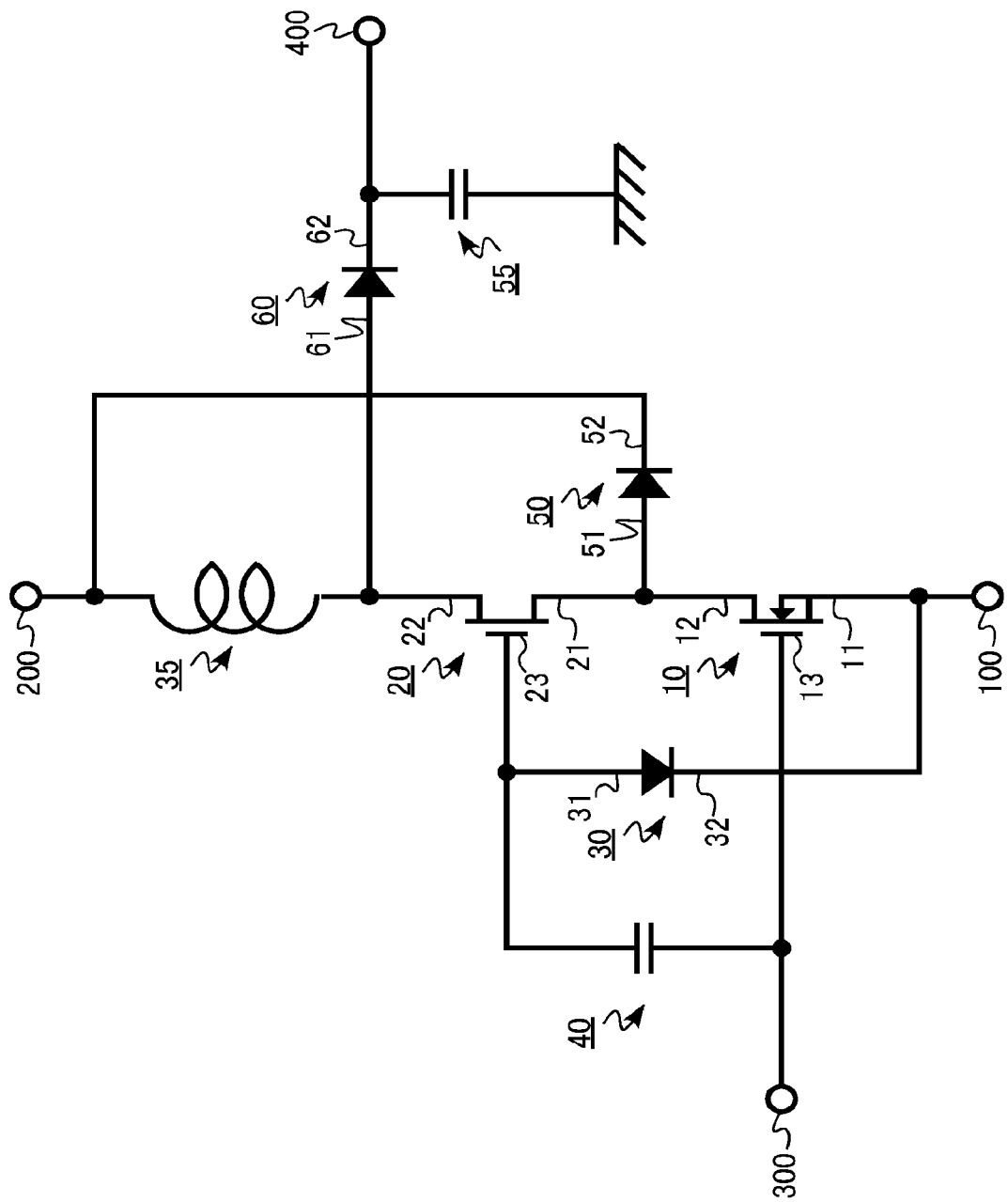
FIG. 1 is a circuit diagram illustrating a semiconductor device according to a first embodiment.

A semiconductor device according to an embodiment includes a normally-off transistor having a first drain, a first source electrically connected to a source terminal, and a first gate electrically connected to a gate terminal, a normally-on transistor having a second gate, a second source electrically connected to the first drain, and a second drain electrically connected to a voltage terminal, a first capacitor provided between the gate terminal and the second gate, a first diode having a first anode electrically connected to the first capacitor and the second gate, and a first cathode electrically connected to the first source, a coil component provided between the voltage terminal and the second drain, and a second diode having a second anode electrically connected to the first drain and the second source, and a second cathode electrically connected to the coil component and the voltage terminal.

Embodiments of the present disclosure will be described below with reference to the drawings. Note that, in the following description, a same member and the like will be denoted by a same reference sign, and a description for a member and the like once described will be suitably omitted.

Further, in the present specification, note that the a concept of the semiconductor device includes: a power module formed by combining a plurality of elements such as discrete semiconductors; an intelligent power module having the elements such as discrete semiconductors embedded with a self-protection function and a drive circuit to drive the mentioned elements; or an entire system including the power module and the intelligent power module.

Further, in the present specification, note that an "inductor" is an electronic component capable of storing energy in a magnetic field formed of flowing current. The "inductor" has the same meaning as a "coil".

Furthermore, in the present specification, note that a "transformer" means an electronic component that converts a voltage height of AC power by utilizing electromagnetic induction. The "transformer" includes a plurality of coils magnetically connected.

Further, in the present specification, note that a "coil component" means an electronic component including a coil. Exemplary coil components are, for example, the inductor and the transformer.

In the present specification, note that "GaN-based semiconductor" is a collective term for a semiconductor including gallium nitride (GaN), aluminum nitride (AlN), indium nitride (InN), and an intermediate composition thereof.

First Embodiment

A semiconductor device according to the present embodiment includes a normally-off transistor having a first drain, a first source electrically connected to a source terminal, and a first gate electrically connected to a gate terminal, a normally-on transistor having a second gate, a second source electrically connected to the first drain, and a second drain electrically connected to a voltage terminal, a first capacitor provided between the gate terminal and the second gate, a first diode having a first anode electrically connected to the first capacitor and the second gate, and a first cathode electrically connected to the first source, a coil component provided between the voltage terminal and the second drain, and a second diode having a second anode electrically connected to the first drain and the second source, and a second cathode electrically connected to the coil component and the voltage terminal.

The semiconductor device according to the present embodiment has the coil component that is an inductor.

Further, the semiconductor device according to the present embodiment further includes a third diode having a third cathode and a third anode electrically connected between the second drain and the inductor, and a second capacitor electrically connected to the third cathode.

The semiconductor device according to the present embodiment is a power converter. The semiconductor device according to the present embodiment is, specifically, a non-isolated boosting chopper circuit that boosts power voltage Vdd. In the non-isolated boosting chopper circuit according to the present embodiment, a circuit connecting a normally-on transistor and a normally-off transistor in series is used as a switching device.

FIG. 1 is a circuit diagram illustrating a semiconductor device according to the present embodiment.

In the switching device of the semiconductor device according to the present embodiment, a normally-off transistor 10 and a normally-on transistor 20 are connected in series. The normally-off transistor 10 and the normally-on transistor 20 implement a normally-off switching device by a so-called cascode connection.

The normally-off transistor 10 is, for example, a vertical metal oxide semiconductor field effect transistor (MOSFET) of silicon (Si). Further, the normally-on transistor 20 is, for example, an HEMT of a gallium nitride-based (GaN-based) semiconductor. The normally-on transistor 20 includes a gate insulating film.

Note that the normally-off transistor 10 includes a parasitic body diode not illustrated.

The normally-off transistor 10 has low breakdown voltage, compared to the normally-on transistor 20. The normally-off transistor 10 has the breakdown voltage of 10 V or more and 30 V or less, for example. Further, the normally-on transistor 20 has the breakdown voltage of 600 V or more and 1200 V or less, for example.

The semiconductor device includes a source terminal 100, a voltage terminal 200, and a gate terminal 300. The normally-off transistor 10 includes a first source 11 connected to the source terminal 100, a first drain 12, and a first gate 13 connected to the gate terminal 300. The normally-on transistor 20 includes a second source 21 connected to the first drain 12, a second drain 22 connected to the voltage terminal 200, and a second gate 23.

The semiconductor device includes a first capacitor 40 provided between the gate terminal 300 and the second gate 23. Further, the semiconductor device includes first diode 30 having a first anode 31 and a first cathode 32. The first anode 31 is connected to the first capacitor 40 and the second gate 23. The first cathode 32 is connected to the first source 11. The first diode 30 is, for example, a PiN diode or a Schottky barrier diode.

The semiconductor device includes an inductor 35 as the coil component. The inductor 35 is provided between the voltage terminal 200 and the second drain 22.

The semiconductor device includes a second diode 50 having a second anode 51 and a second cathode 52. The second anode 51 is connected to the first drain 12 and the second source 21. The second cathode 52 is connected to the inductor 35 and the voltage terminal 200.

The semiconductor device includes a third diode 60 having a third anode 61 and a third cathode 62. The third anode 61 is connected to the second drain 22 and the inductor 35.

Further, the semiconductor device includes a second capacitor 55. The second capacitor 55 has one end connected to the third cathode 62. The second capacitor 55 has the other end fixed to, for example, ground potential.

For example, an output terminal 400 is provided on the third cathode 62 side of the third diode 60.

In the following, operation of the semiconductor device according to the present embodiment will be described.

When the switching device according to the present embodiment formed of the normally-off transistor 10 and the normally-on transistor 20 is in an ON state, 0 V is applied to the source terminal 100 and positive voltage is applied to the second drain 22. Further, positive voltage such as 10 V is applied to the gate terminal 300.

At this point, positive voltage is applied to the first gate 13 of the normally-off transistor 10. Therefore, the normally-off transistor 10 performs ON operation.

On the other hand, the second gate 23 of the normally-on transistor 20 is clamped at the source terminal 100 via the first diode 30. Therefore, voltage at the second gate 23 is positive voltage close to 0 V, more accurately, forward drop voltage (Vf) of the first diode 30.

The second source 21 comes to have potential close to 0 V by turning on the normally-off transistor 10. Therefore, the normally-on transistor 20 also comes to perform ON operation. Accordingly, ON current flows between the source terminal 100 and the second drain 22.

Next, a case where the switching device is changed from an ON state to an OFF state will be studied. In this case, applied voltage to the gate terminal 300 is changed from positive voltage to 0 V or negative voltage. The gate terminal 300 is decreased to 0 V from 10 V, for example.

First, 0 V is applied to the first gate 13 of the normally-off transistor 10. Therefore, the normally-off transistor 10 performs OFF operation.

On the other hand, potential at the second gate 23 of the normally-on transistor 20 is lowered by an amplitude amount of the gate terminal 300 due to existence of the first capacitor 40. For example, the potential is lowered by 10 V to negative potential (Vf−10) V from the forward drop voltage (Vf) of the first diode 30 by the amplitude amount of the gate terminal 300.

Further, when the second gate 23 reaches a threshold voltage or less of the normally-on transistor 20, the normally-on transistor 20 performs OFF operation. Therefore, current between the source terminal 100 and the second drain 22 is shut off.

The switching device according to the present embodiment functions as a normally-off transistor in which the source terminal 100 is a source, the second drain 22 is a drain, and the gate terminal 300 is a gate. Further, the switching device according to the present embodiment is configured such that the normally-on transistor 20 performs OFF operation before the normally-off transistor 10 when the state shifts from the ON state to the OFF state.

When the switching device is in the ON state, current flows from the voltage terminal 200 to the source terminal 100. The current also flows in the inductor 35. Even when the switching device shifts from the ON state to the OFF state, the current continues flowing in the inductor 35 for a predetermined period. Therefore, even when the switching device is in the OFF state, the current passes through the third diode 60 and flows to the output terminal 400 side.

The power voltage Vdd is applied to the voltage terminal 200. The switching device is made to perform ON/OFF operation at a predetermined duty ratio, thereby transmitting energy stored in the inductor 35 to the output terminal 400 side. Then, the power voltage Vdd turns to boosted output voltage.

The power voltage Vdd is, for example, 10 V or more and 50 V or less. Further, the boosted output voltage is, for example, 50 V or more and 200 V or less.

Next, functions and effects of the semiconductor device according to the present embodiment will be described.

Figure 2:
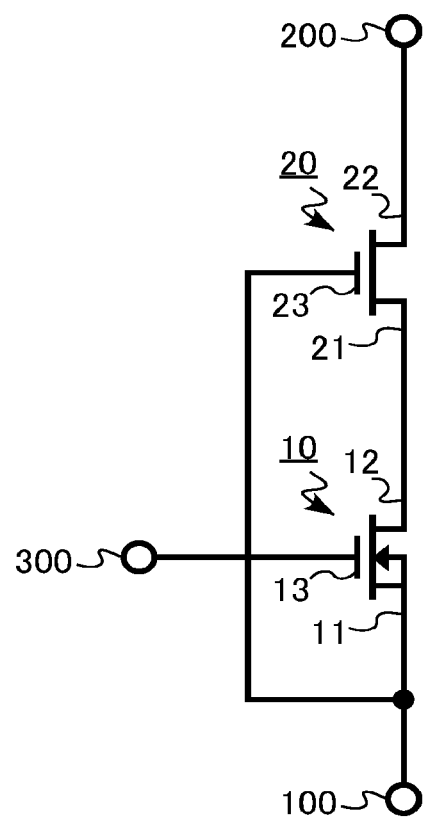
FIG. 2 is a circuit diagram illustrating a switching device according to a comparative embodiment.

FIG. 2 is a circuit diagram illustrating a switching device according to a comparative embodiment. The semiconductor device according to the comparative embodiment has a circuit configuration in which a normally-off transistor 10 is cascode-connected to a normally-on transistor 20. The normally-off transistor 10 and the normally-on transistor 20 are transistors same as the present embodiment.

This switching device includes a source terminal 100, a voltage terminal 200, and a gate terminal 300. Further, the normally-off transistor 10 includes a first source 11 connected to the source terminal 100, a first drain 12, and a first gate 13 connected to the gate terminal 300. Furthermore, the normally-on transistor 20 includes a second source 21 connected to the first drain 12, a second drain 22 connected to the voltage terminal 200, and a second gate 23 connected to the source terminal 100.

The switching device according to the comparative embodiment also functions as the normally-off transistor in which the source terminal 100 is a source, the voltage terminal 200 is a drain, and the gate terminal 300 is a gate.

In the circuit configuration of the comparative embodiment, there may be possibility that overvoltage may occur at a connecting portion between the normally-off transistor 10 and the normally-on transistor 20 during device operation. The connecting portion between the normally-off transistor 10 and the normally-on transistor 20 corresponds to the first drain 12 of the normally-off transistor 10 and the second source 21 of the normally-on transistor 20.

For example, when the switching device shifts from an ON state to an OFF state, transient current is generated, and high voltage applied between the source terminal 100 and the voltage terminal 200 is divided at a ratio of parasitic capacitance between the normally-off transistor 10 and the normally-on transistor 20, thereby causing overvoltage.

In the case of the comparative embodiment, when the state shifts from the ON state to the OFF state, the normally-off transistor 10 is turned off and then voltage is first boosted at the connecting portion. Subsequently, the normally-on transistor 20 performs OFF operation when a potential difference between the second source 21 and the second gate 23 clamped at 0 V reaches a threshold voltage. Therefore, when the potential at the connecting portion rises due to the transient current, overvoltage occurs at the connecting portion because there is no passage to release charge.

When overvoltage occurs, high voltage is applied between the second source 21 and the second gate 23 of the normally-on transistor 20. When this overvoltage reaches breakdown voltage or more of a gate insulating film, leak current at the gate insulating film of the normally-on transistor 20 is increased. Or, there maybe possibility that the gate insulating film is broken. When leak current is increased at the gate insulating film of the normally-on transistor 20 or when the gate insulating film is broken, the semiconductor device including the switching device malfunctions. Therefore, reliability of the semiconductor device is degraded.

Further, even in the case where no problem occurred at the gate insulating film, charge may be trapped to the second source 21 side by the high voltage applied between the second source 21 and the second gate 23 of the normally-on transistor 20. Such trapping of charge may cause current collapse. When current collapse occurs, ON current is decreased, thereby causing malfunction. Therefore, reliability of the semiconductor device is also degraded.

The switching device according to the present embodiment is configured such that the normally-on transistor 20 performs OFF operation before the normally-off transistor 10 when the state shifts from the ON state to the OFF state. Since the normally-on transistor 20 performs OFF operation earlier, overvoltage is prevented from occurring at the connecting portion between the normally-off transistor 10 and the normally-on transistor 20, more specifically, between the first drain 12 and the second source 21. Even when potential at the connecting portion is increased by transient current when the normally-on transistor 20 performs OFF operation earlier, charge can be released to the source terminal 100 by the normally-off transistor 10 turned on.

Further, overvoltage may also be caused by capacitance division at the connecting portion not only when the state shifts from the ON state to the OFF state but also when the semiconductor device is started with initial power application or when the semiconductor device is restarted after being stopped for a predetermined period.

The semiconductor device according to the present embodiment includes the second diode 50 having a second anode 51 and the second cathode 52. The second anode 51 is connected to the first drain 12 and the second source 21. The second cathode 52 is connected to the inductor 35 and the voltage terminal 200. In other words, the connecting portion of the switching device is connected to the voltage terminal 200, interposing the second diode 50.

Therefore, even when overvoltage is applied to the first drain 12 and the second source 21, current flows to the voltage terminal 200 from the first drain 12 and the second source 21 when overvoltage exceeds the power voltage Vdd. Therefore, overvoltage at the connecting portion is suppressed. As a result, reliability of the semiconductor device is improved.

Further, according to the present embodiment, when overvoltage occurs at the connecting portion at the time of startup or restart, excessive charge induced at the connecting portion is returned to a power source. Therefore, energy is regenerated, and energy efficiency in the boosting chopper circuit is improved.

In the present embodiment, preferably, sheet resistance of the normally-on transistor 20 is lower than sheet resistance of a gate electrode material of the normally-off transistor 10. The reason is that configuration can be easily made such that the normally-on transistor 20 performs OFF operation before the normally-off transistor 10 when the state shifts from the ON state to the OFF state.

Further, when the state shifts from the ON state to the OFF state, preferably, configuration is made such that the normally-off transistor 10 performs ON operation before the normally-on transistor 20. The reason is that in the case where the normally-on transistor 20 performs ON operation earlier, high voltage is applied to the connecting portion, and characteristics of the normally-off transistor 10 may be degraded.

Further, capacity of the first capacitor 40 is preferably 10 times or more and 100 times or less of input capacity of the normally-on transistor 20. Negative voltage applied to the second gate 23 of the normally-on transistor 20 is determined by a ratio between the capacity of the first capacitor 40 and input capacity of the normally-on transistor 20. Therefore, preferably, the first capacitor 40 has the large capacity.

In the case where the capacity of the first capacitor 40 is 10 times or more of the input capacity of the normally-on transistor 20, 90 percent or more of amplitude applied to the gate terminal 300 can be applied. Further, in the case where the capacity exceeds 100 times, the first capacitor becomes too large and may cause size increase of the semiconductor device.

Note that the input capacity of the normally-on transistor 20 corresponds to capacity between the second gate 23 and, the second source 21 and the second drain 22. The input capacity is a value when bias of the second source 21 and the second drain 22 is 0 V and in a pinch-off state.

Further, according to the present embodiment, particularly a switching speed from the ON state to the OFF state is specified by the normally-on transistor 20 formed of the GaN-based HEMT having a fast switching speed, different from the comparative embodiment. Therefore, the semiconductor device having a fast switching speed can be implemented.

As described above, according to the present embodiment, the semiconductor device having improved reliability can be implemented. Further, the semiconductor device having high energy efficiency is implemented.

Second Embodiment

A semiconductor device according to the present embodiment is same as a first embodiment except for further including a first resistance element that has one end connected to a gate terminal and a first capacitor and the other end connected to a first gate. Therefore, repetition of the same description as the first embodiment will be omitted.

Figure 3:
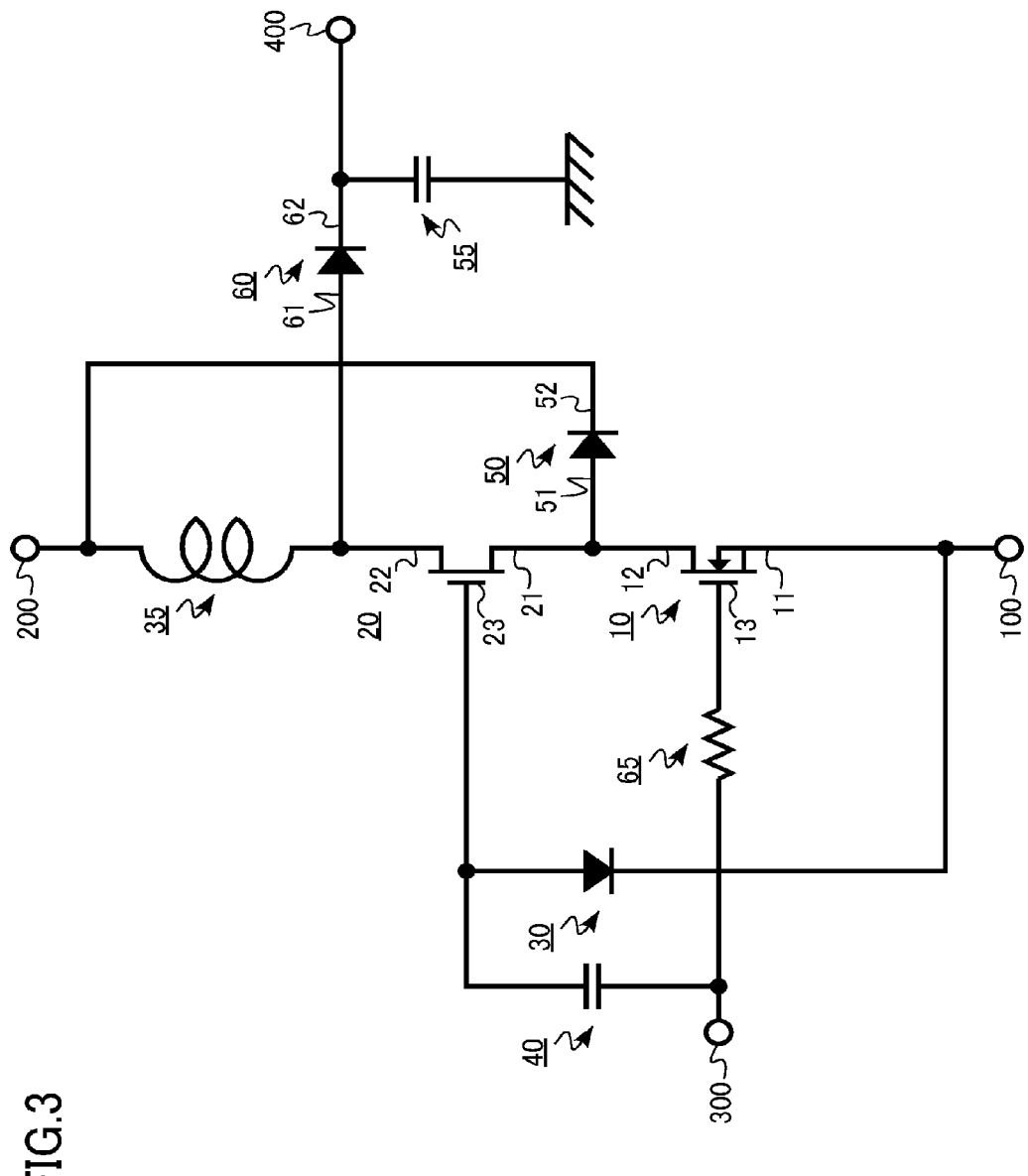
FIG. 3 is a circuit diagram illustrating a semiconductor device according to a second embodiment.

FIG. 3 is a circuit diagram illustrating the semiconductor device according to the present embodiment.

The semiconductor device according to the present embodiment includes a first resistance element 65 that has one end connected to a gate terminal 300 and a first capacitor 40 and the other end connected to a first gate 13.

In order to prevent overvoltage at a connecting portion, a normally-on transistor 20 performs OFF operation before the normally-off transistor 10 when a switching device shifts from an ON state to an OFF state. By providing the first resistance element 65, OFF timing of the normally-off transistor 10 and OFF timing of the normally-on transistor 20 can be delayed by a predetermined period. Therefore, the normally-on transistor 20 is easily made to perform OFF operation before the normally-off transistor 10.

Preferably, resistance at the first resistance element 65 is 1Ω or more and 100Ω or less. In the case where the resistance is lower than this range, a significant delay period may not be achieved. In the case where the resistance is higher than this range, the delay period may become too long and may decrease the switching speed of the semiconductor device, which is not preferable.

According to the present embodiment, stable operation of the semiconductor device can be achieved by adjusting the OFF timing of the normally-off transistor 10 and the normally-on transistor 20 in addition to effects of the first embodiment.

Third Embodiment

A semiconductor device according to the present embodiment is same as a second embodiment except for further including a fourth diode having a fourth anode connected to a gate terminal and a fourth cathode connected to a first gate, and provided in parallel to a first resistance element between the gate terminal and the first gate. Therefore, repetition of the same description as the second embodiment will be omitted.

Figure 4:
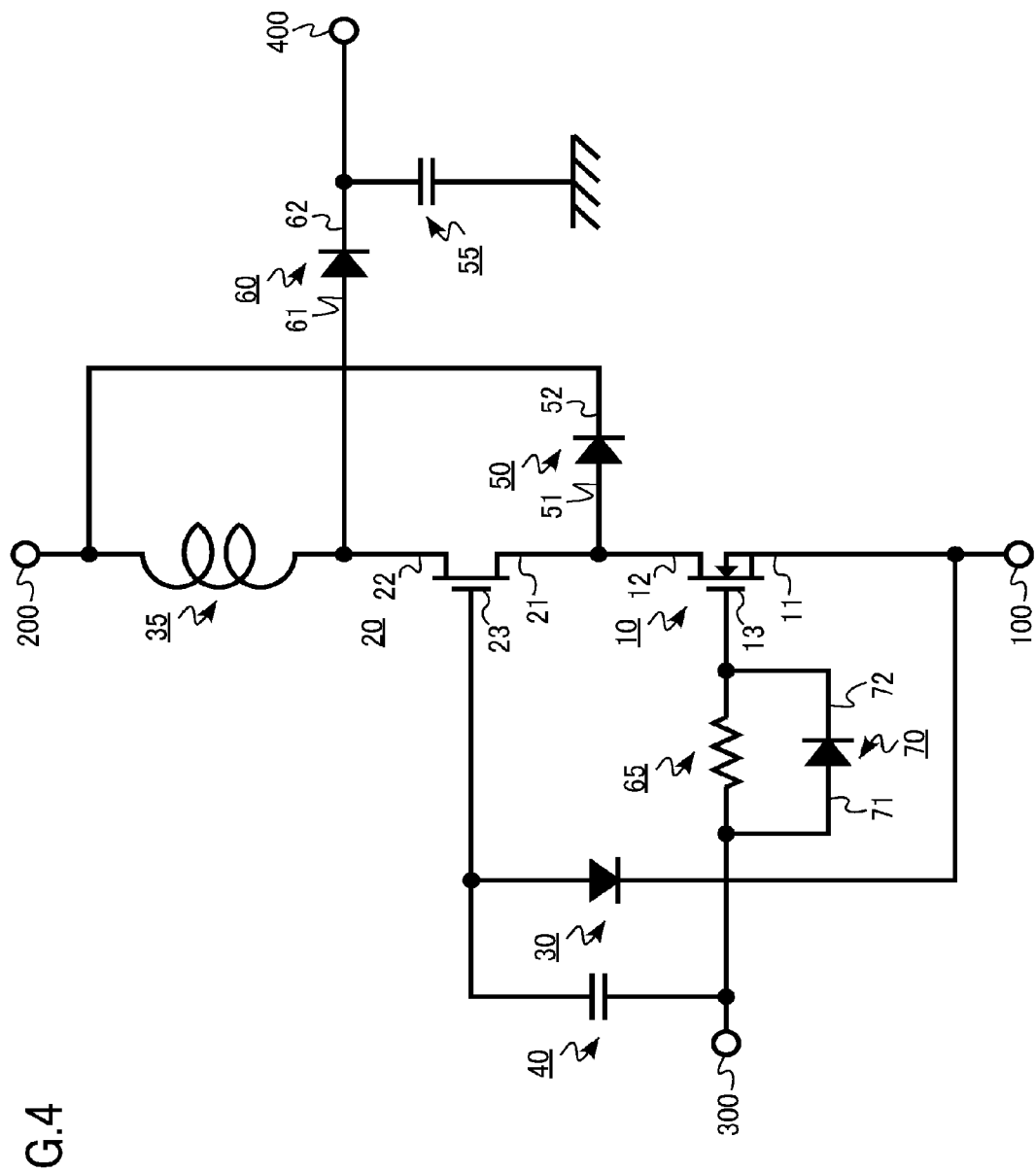
FIG. 4 is a circuit diagram illustrating a semiconductor device according to a third embodiment.

FIG. 4 is a circuit diagram illustrating a semiconductor device according to the present embodiment.

In the semiconductor device according to the present embodiment, a fourth diode 70 is provided between a gate terminal 300 and a first gate 13 in parallel to a first resistance element 65. The fourth diode 70 includes a fourth anode 71 and a fourth cathode 72.

The fourth anode 71 is connected to the gate terminal 300. The fourth cathode 72 is connected to the first gate 13. The fourth diode 70 is, for example, a PiN diode or a Schottky barrier diode.

Preferably, a normally-off transistor 10 performs ON operation before a normally-on transistor 20 when a switching device shifts from an ON state to an OFF state. The reason is that in the case where the normally-on transistor 20 performs ON operation earlier, high voltage is applied to a first drain 12 and a second source 21, and characteristics of the normally-off transistor 10 may be degraded.

According to the present embodiment, current flows in the fourth diode 70 when the state shifts from the OFF state to the ON state. Therefore, the first gate 13 can be charged quickly because of having no influence from the first resistance element 65. Therefore, ON timing of the normally-off transistor 10 is accelerated, compared to the case without having the fourth diode 70. Therefore, when the state shifts from the OFF state to the ON state, the normally-off transistor 10 can be surely turned on before the normally-on transistor 20.

According to the present embodiment, protection for the normally-off transistor 10 is enhanced, and reliability of the semiconductor device is further improved in addition to effects of the second embodiment.

Fourth Embodiment

A semiconductor device according to the present embodiment is same as a third embodiment except for further including a second resistance element provided between a gate terminal, and a first capacitor and a first gate. Therefore, repetition of the same description as the third embodiment will be omitted.

Figure 5:
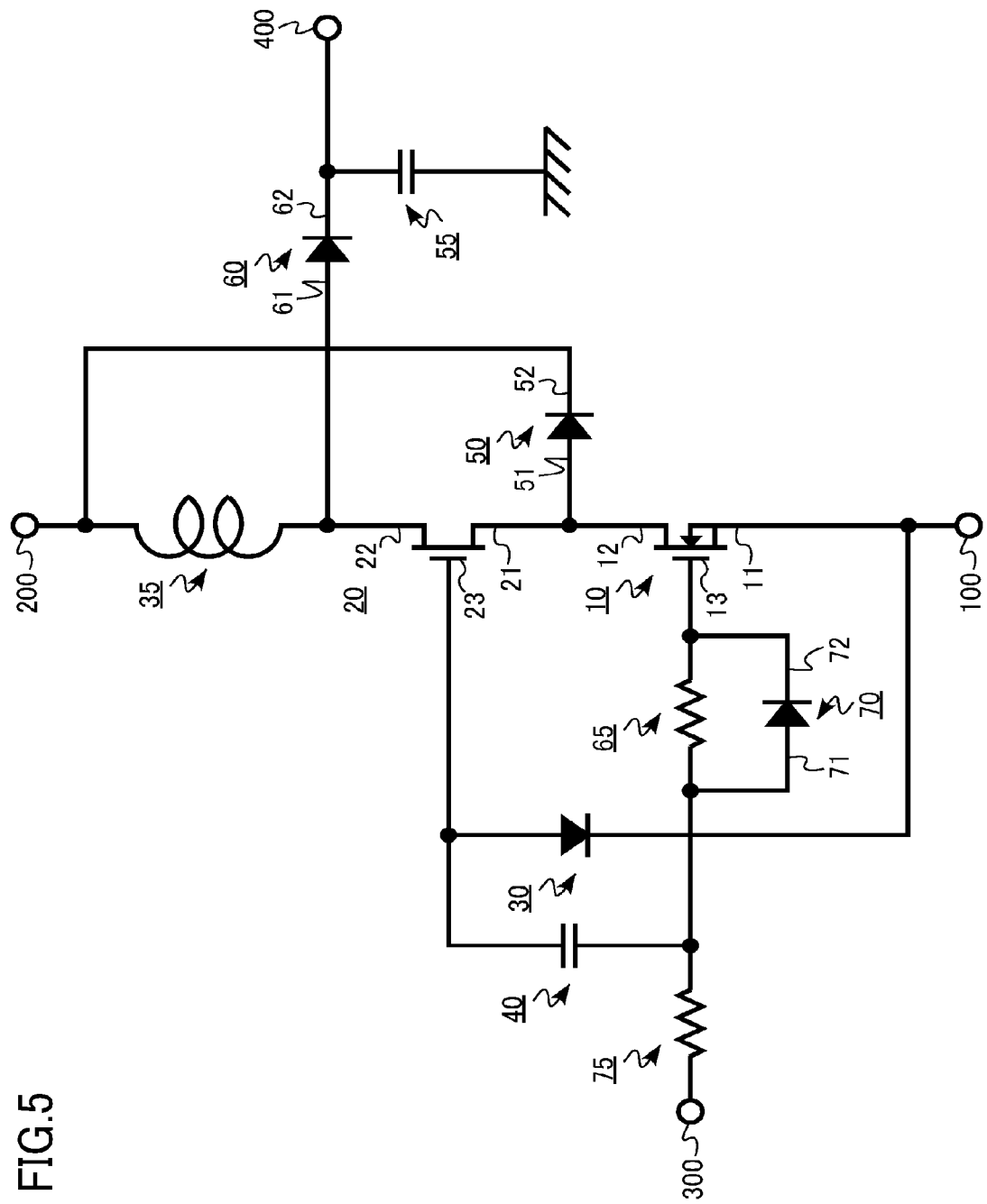
FIG. 5 is a circuit diagram illustrating a semiconductor device according to a fourth embodiment.

FIG. 5 is a circuit diagram illustrating a semiconductor device according to the present embodiment.

The semiconductor device according to the present embodiment includes a second resistance element 75 provided between a gate terminal 300, and a first capacitor 40 and a first gate 13.

In a power electronics circuit design, there may be a case where adjustment of an operation speed of a transistor is demanded for the purpose of noise prevention. According to the present embodiment, transmission of gate voltage applied to the gate terminal 300 to the first gate 13 and a second gate 23 can be delayed by providing the second resistance element 75. Therefore, an operation speed (switching speed) of the semiconductor device can be adjusted.

Meanwhile, the circuit including a first resistance element 65 and a fourth diode 70 has been described as an example, but a circuit can be configured without the first resistance element 65 and the fourth diode 70 in the present embodiment.

According to the present embodiment, the operation speed (switching speed) of the semiconductor device can be adjusted in addition to the effects of the third embodiment.

Fifth Embodiment

A semiconductor device according to the present embodiment is same as a first embodiment except for that a coil component is a transformer and a third diode 60 and a second capacitor 55 constituting a boosting chopper circuit are not included. Therefore, repetition of the same description as the first embodiment will be omitted.

The semiconductor device according to the present embodiment is a power converter. The semiconductor device according to the present embodiment is, specifically, a transformer (voltage transformer) that transforms voltage of power voltage Vdd. In the transformer according to present embodiment, a circuit in which a normally-on transistor and a normally-off transistor are connected in series is used as a switching device.

Figure 6:
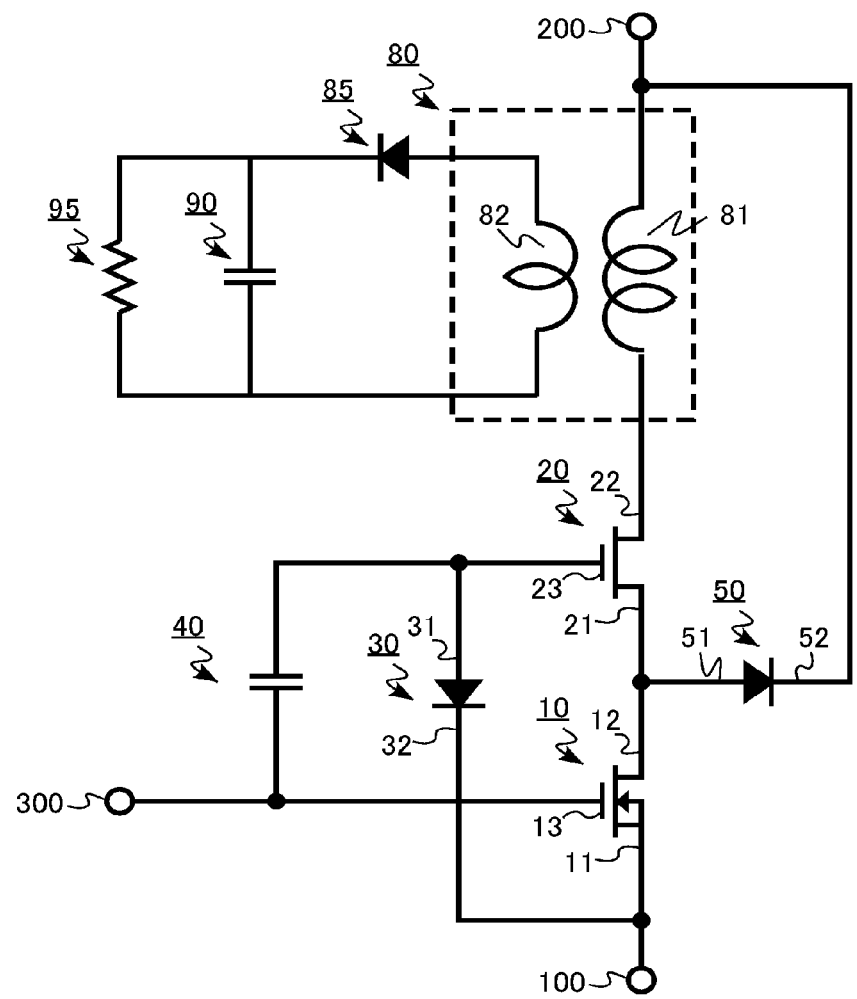
FIG. 6 is a circuit diagram illustrating a semiconductor device according to a fifth embodiment.

FIG. 6 is a circuit diagram illustrating a semiconductor device according to the present embodiment.

According to the semiconductor device according to the present embodiment, a transformer 80 is provided between a voltage terminal 200 and a second drain 22 of a normally-on transistor 20. The transformer 80 includes a primary coil 81 and a secondary coil 82. Further, as illustrated in FIG. 6, the secondary coil 82 of the transformer 80 is connected to, for example, a diode 85, a capacitor 90, and a load resistance 95.

The semiconductor device according to the present embodiment transforms the power voltage Vdd applied to the voltage terminal 200 by using the transformer 80. The power voltage Vdd is, for example, 10 V or more and 50 V or less. Further, the transformed voltage is 50 V or more and 200 V or less, for example.

In the switching device according to the present embodiment, the normally-on transistor 20 performs OFF operation before a normally-off transistor 10 when a state shifts from an ON state to an OFF state same as the first embodiment. Since the normally-on transistor 20 performs OFF operation earlier, overvoltage is prevented from occurring at a connecting portion between the normally-off transistor 10 and the normally-on transistor 20, more specifically, between a first drain 12 and a second source 21.

Further, overvoltage at the connecting portion may be caused by capacitance division not only when the state shifts from the ON state to the OFF state but also when the semiconductor device is started with initial power application, or when the semiconductor device is restarted after being stopped for a predetermined period.

The semiconductor device according to the present embodiment includes a second diode 50 having a second anode 51 and the second cathode 52 same as the first embodiment. Further, the second anode 51 is connected to the first drain 12 and the second source 21. The second cathode 52 is connected to the transformer 80 and the voltage terminal 200. In other words, the first drain 12 and the second source 21 are connected to the voltage terminal 200, interposing the second diode 50.

Therefore, even when overvoltage is applied to the first drain 12 and the second source 21, current flows to the voltage terminal 200 from the first drain 12 and the second source 21 when overvoltage exceeds the power voltage Vdd. Therefore, overvoltage at the connecting portion is suppressed. As a result, reliability of the semiconductor device is improved.

Further, according to the present embodiment, excessive charge induced at the first drain 12 and the second source 21 is returned to a power source when overvoltage occurs at the time of startup or restart. Therefore, energy is regenerated, and energy efficiency in the transformer is improved.

As described above, according to the present embodiment, the semiconductor device having improved reliability can be implemented same as the first embodiment. Further, the semiconductor device having high energy efficiency is implemented.

According to the first to fourth embodiments, the case where the semiconductor device is the boosting chopper circuit and the transformer (voltage transformer) has been described as an example, but the present disclosure can be also applied to a relay circuit in which a coil component is an inductor, for example.

Further, the case where the normally-on transistor 20 is the HEMT of the gallium nitride-based (GaN-based) semiconductor has been described as an example. However, a transistor using other wide bandgap semiconductors such as silicon carbide (SiC) and diamond can also be applied to the normally-on transistor 20.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a normally-off transistor having a first drain, a first source electrically connected to a source terminal, and a first gate electrically connected to a gate terminal;
a normally-on transistor having a second gate, a second source electrically connected to the first drain, and a second drain electrically connected to a voltage terminal;
a first capacitor provided between the gate terminal and the second gate;
a first diode having a first anode electrically connected to the first capacitor and the second gate, and a first cathode electrically connected to the first source;
a coil component provided between the voltage terminal and the second drain; and
a second diode having a second anode electrically connected to the first drain and the second source, and a second cathode electrically connected to the coil component and the voltage terminal.

2. The device according to claim 1, wherein the normally-on transistor is an HEMT of a GaN-based semiconductor.

3. The device according to claim 1, wherein the coil component is an inductor.

4. The device according to claim 1, wherein the coil component is a transformer.

5. The device according to claim 3, further comprising:
a third diode having a third cathode and a third anode electrically connected to the second drain and the inductor; and
a second capacitor electrically connected to the third cathode.

6. The device according to claim 1, further comprising a first resistance element having one end electrically connected to the gate terminal and the first capacitor, the other end electrically connected to the first gate.

7. The device according to claim 6, further comprising a fourth diode having a fourth anode electrically connected to the gate terminal and a fourth cathode electrically connected to the first gate, the fourth diode provided between the gate terminal and the first gate in parallel to the first resistance element.

8. The device according to claim 1, further comprising a second resistance element provided between the gate terminal, and the first capacitor and the first gate.

9. The device according to claim 1, wherein capacity of the first capacitor is 10 times or more of input capacity of the normally-on transistor.

10. The device according to claim 1, wherein the normally-off transistor is a MOSFET of Si.

* * * * *